(12) United States Patent
Kinoshita et al.

(10) Patent No.: US 6,324,061 B1
(45) Date of Patent: Nov. 27, 2001

(54) HEAT SINK

(75) Inventors: Joji Kinoshita, Taipei (TW); Takahiro Kinoshita, Osaka (JP)

(73) Assignee: Yamato Corporation, Taipei (TW)

( * ) Notice: Subject to any disclaimer, the term of this patent is extended or adjusted under 35 U.S.C. 154(b) by 0 days.

(21) Appl. No.: 09/703,165

(22) Filed: Oct. 31, 2000

(51) Int. Cl.⁷ .................................................. H05K 7/20
(52) U.S. Cl. ..................... 361/709; 361/704; 361/710; 257/706; 257/707; 257/722; 174/16.3; 165/80.3
(58) Field of Search ..................................... 361/704, 709, 361/710; 257/706, 707, 722; 174/16.3; 165/80.1, 80.3, 185

(56) References Cited

U.S. PATENT DOCUMENTS

| D. 426,195 | * | 6/2000 | Kuo ..................................... D13/179 |
| 4,009,752 | * | 3/1977 | Wilson .................................... 165/81 |
| 5,558,155 | * | 9/1996 | Ito ........................................ 165/80.3 |
| 6,104,609 | * | 8/2000 | Chen ..................................... 361/695 |

FOREIGN PATENT DOCUMENTS

408195452-A * 7/1996 (JP) ................................. H01L/23/36

* cited by examiner

*Primary Examiner*—Gerald Tolin
*Assistant Examiner*—Boris L. Chervinsky
(74) *Attorney, Agent, or Firm*—Koda & Androlia

(57) ABSTRACT

A heat sink comprising a plurality of cooling fins and a plurality of spacers. Each of the cooling fins is formed to assume a shape of letter L by bending a lower end of a metallic plate so that the bent portions serve as heat-collecting portions, and the spacers are provided between adjoining cooling fins for maintaining intervals between the cooling fins and for pressing the heat-collection portions of the cooling fins to the heat-radiating surface of an electronic component. The cooling fins and spacers are connected by connecting rods piercing through portions at which the fins and spacers are overlapped.

9 Claims, 5 Drawing Sheets

HEAT SINK

BACKGROUND OF THE INVENTION

1. Field of the Invention

The present invention relates to a heat sink mounted on a heat-radiating surface of a heat-producing electronic component such as a CPU or Peltier elements for absorbing and radiating heat into air.

2. Explanations of the Prior Art

Conventional heat sink is manufactured by extrusion molding of aluminum.

Drawbacks are thus involved. Not only the cooling fins cannot be set to be high but also intervals thereof cannot be narrowed. As a result, it is impossible to improve heat radiation effects.

Another drawback is that the electronic component tends to be broken and damaged owing to the difference in thermal expansion coefficients of the heat-radiating surface and the heat sink when the conventional heat sink is adhered on the heat-radiating surface of the electronic component by an adhesive.

Generally, the heat-radiating surface of an electronic component has subtle swells though it appears to be flat at a glance. Accordingly, when the heat sink is mounted on the heat-radiating surface of an electric component, there is a clearance between the heat-radiating surface and the heat sink. As a result, the heat-radiation effects of the heat sink are deteriorated.

SUMMARY OF THE INVENTION

The object of the present invention is to solve the above-described drawbacks presented in conventional heat sink.

It is another object of the present invention to provide a heat sink that has high heat-radiation effects, that is free of problems of cracks in electronic components owing to differences in thermal expansion coefficients, and that may be easily manufactured.

For this purpose, the heat sink of the present invention comprises a plurality of cooling fins each formed to assume a shape of letter L by bending a lower end of a metallic plate so that these bent portions serve as heat-collecting portions, and a plurality of spacers provided between adjoining cooling fins for maintaining intervals between the cooling fins and for pressing the heat-collecting portions of the cooling fins to a heat-radiating surface of an electronic component, wherein the cooling fins and spacers are connected by connecting rods piercing through portions at which the fins and spacers are overlapped.

With this arrangement, even in the presence of swells in the heat-radiating surface of the electronic component, the heat sink can deform in correspondence to the condition of the heat-radiating surface so as to conform to the heat-radiating surface so that the heat-collecting portions of the cooling fins are fitted along the heat-radiating surface of the electronic component.

It is preferable to form projections in the heat-radiating portions of the cooling fins.

With the projections in the heat-radiating portions of the cooling fins, not only can the heat-radiating effects be improved by the increased contact surfaces with air but also the intervals between the cooling fins can be maintained consistently even when warping deformation occurs in the cooling fins by heat.

In addition, it is preferable to form convex portions on surfaces of the spacers and to form holes in the cooling fins at portions corresponding to the convex portions so that the convex portions of the spacers are fitted in the holes of the cooling fins.

With this arrangement, the spacers and the cooling fins are fixed to each other such that the pressing force applied on the spacers is further applied onto the cooling fins. As a result, the heat-collecting portions of the cooling fins are more effectively fitted along the heat-radiating surface of the electronic component.

In the present invention, the spacers are pressed toward the electronic component side by means of mounting tools with an elastic member interposed in between, so that the heat-collecting portions of the cooling fins are fitted along the heat-radiating surface of the electronic component.

With this arrangement, the pressing force is evenly applied on each one of the spacers, and the heat-collecting portions of the cooling fins are evenly fitted along the heat-radiating surface of the electronic component.

In the present invention, an elastic member is provided below the connecting rods. In this structure, the mounting tools press the spacers with the elastic member interposed in between by pressing the connecting rods with the mounting tools, so that the heat-collecting portions of the cooling fin are fitted to the heat-radiating surface of the electronic component.

With this arrangement, the pressing force is evenly applied on each one of the spacers, and the heat-collecting portions of the cooling fins are well fitted to the heat-radiating surface of the electronic component.

DETAILED DESCRIPTION OF THE PREFERRED EMBODIMENTS

Embodiments of the present invention will be explained based on FIGS. 1 to 5.

Figure 1:
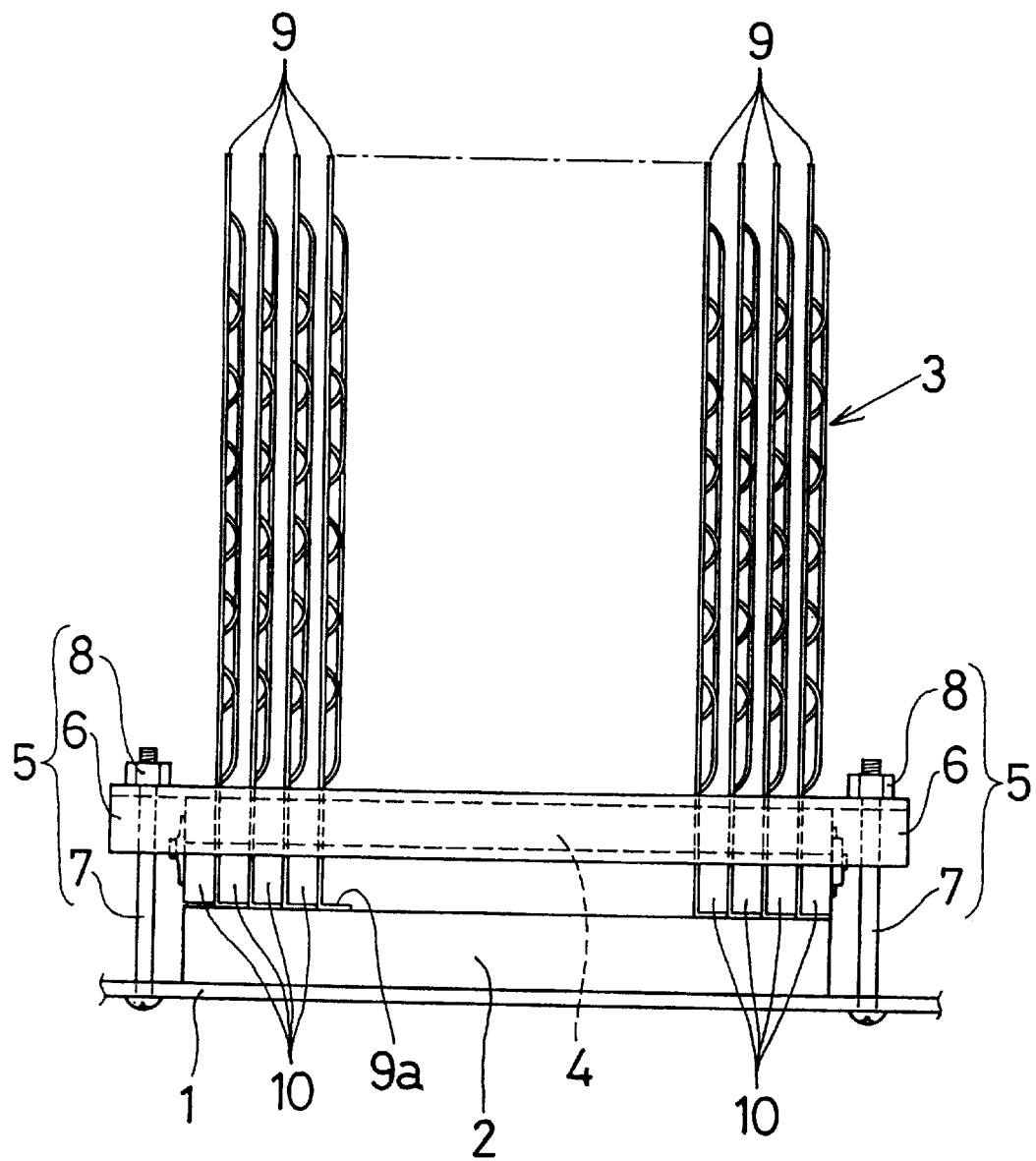
FIG. 1 is a front view showing the use of the heat sink according to one embodiment of the present invention.
Figure 2:
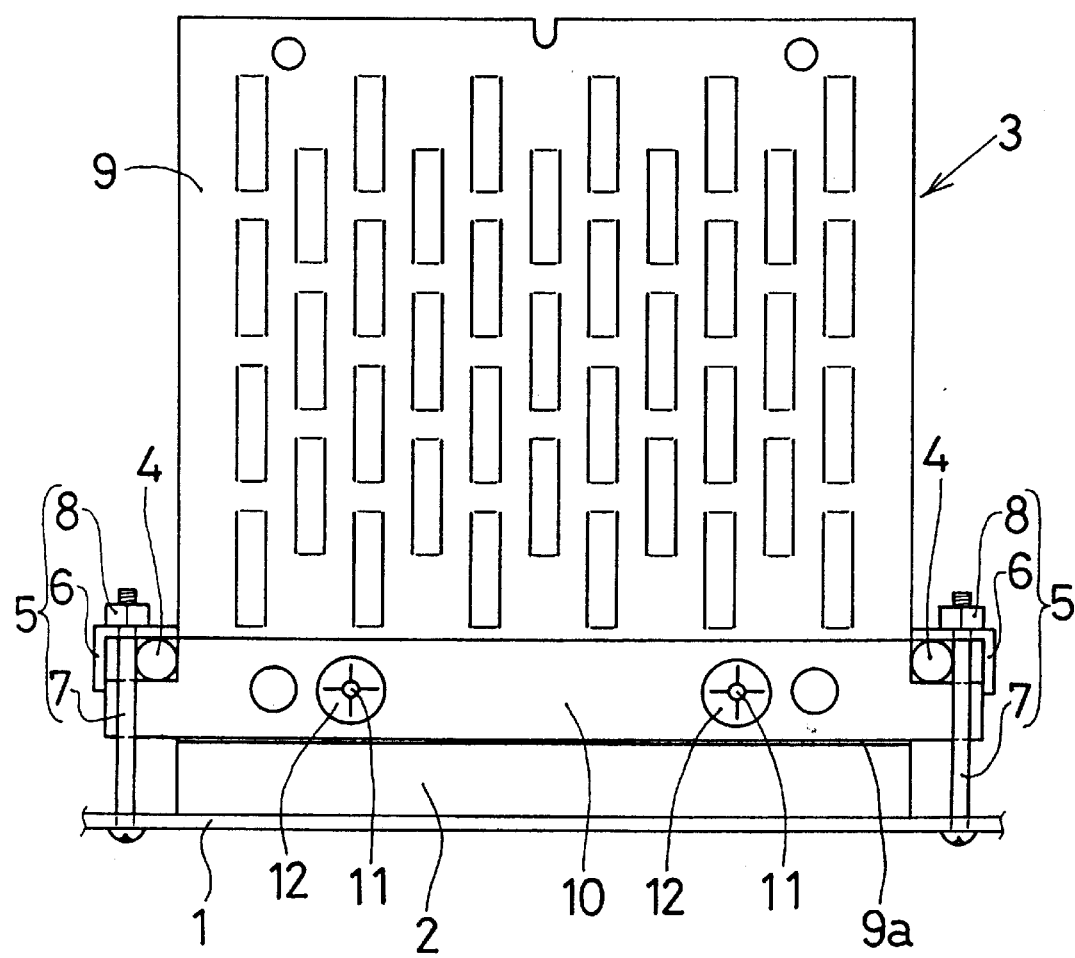
FIG. 2 is a side view thereof.
Figure 3:
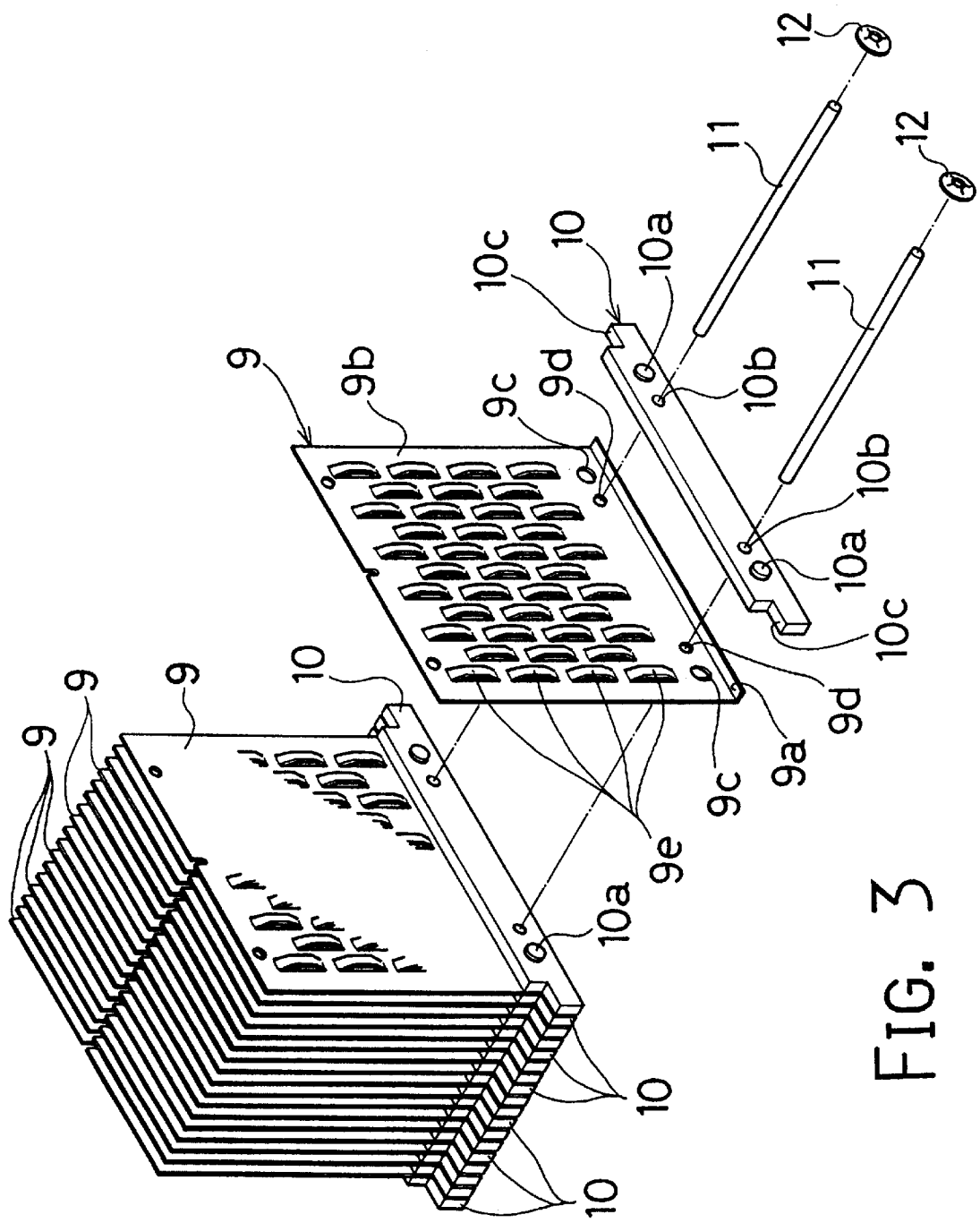
FIG. 3 is an exploded perspective view of the heat sink according to the present invention and FIG. 4 is a front view showing the use of the heat sink according to another embodiment of the present invention.
Figure 4:
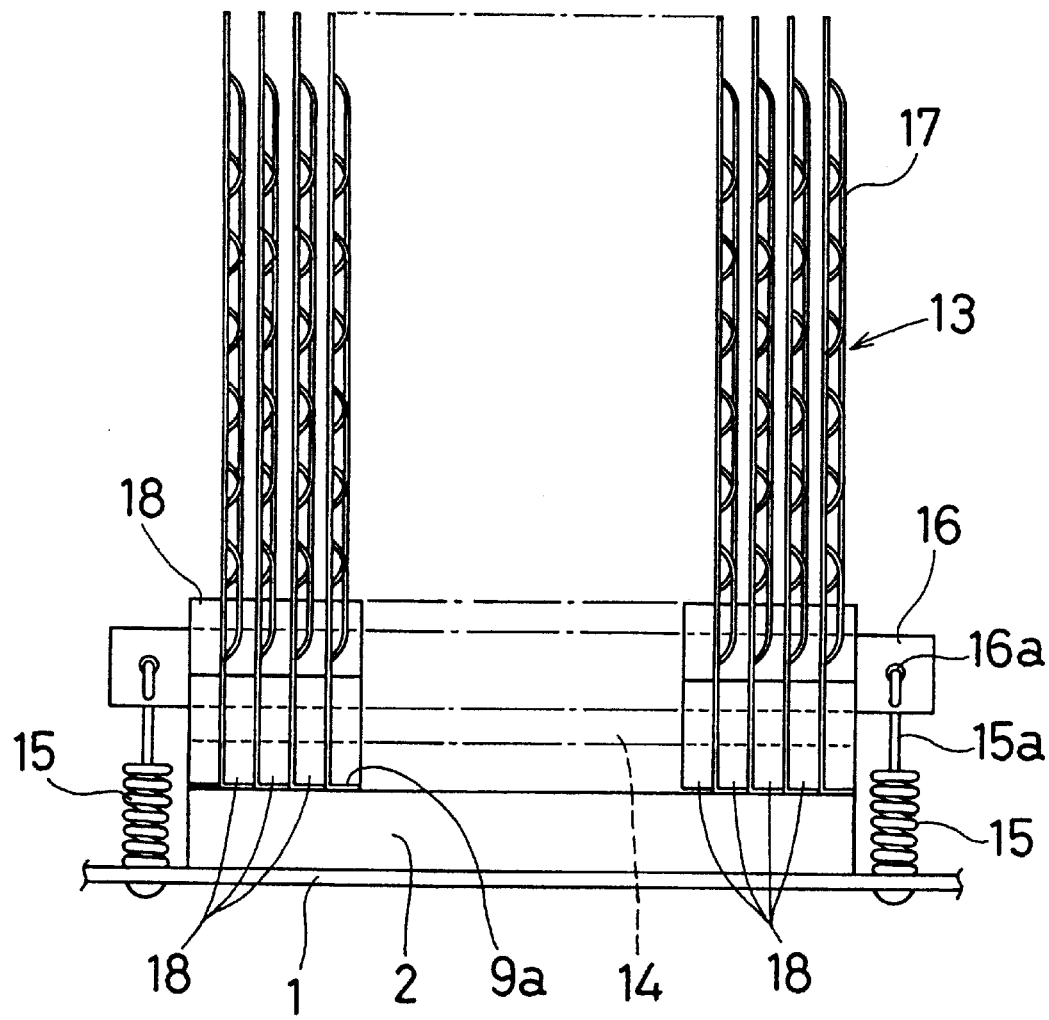
Figure 5:
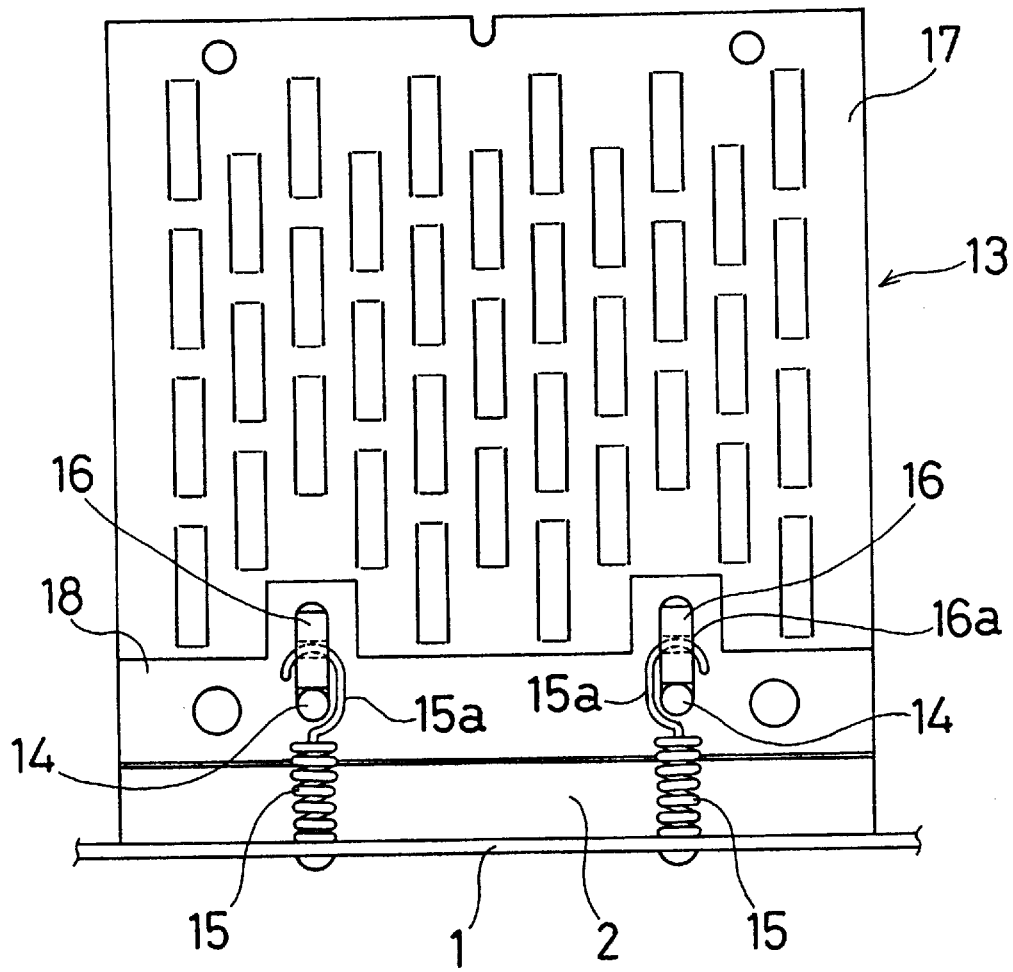
FIG. 5 is a side view thereof.

FIGS. 1 to 3 illustrate the first embodiment of the present invention while FIGS. 4 and 5 illustrate the second embodiment of the present invention.

The first embodiment will be first explained.

FIG. 1 is a front view showing a condition in which the heat sink of the present invention is mounted on Peltier elements, which comprises an electronic component, and FIG. 2 is a side view thereof. FIG. 3 is an exploded perspective view.

While the embodiment will be described based on an example in which the electronic component for cooling is Peltier elements, it is also possible to mount the heat sink of the present invention on any heat-producing electronic component.

The reference numeral 1 denotes a metallic package accumulating therein an object to be cooled, wherein the package has a box-like shape while only one part of the upper surface of the package is illustrated Peltier elements 2 are carried such that the cooling surface located on a lower side thereof closely adheres to the package 1.

The reference numeral 3 denotes the heat sink of the present invention that is carried on a heat-radiating surface of the Peltier elements 2. The heat-radiating surface is located on an upper side of the Peltier elements 2. The heat sink 3 is mounted by being pressed toward the Peltier elements 2 side by mounting tools with an elastic member 4 interposed at either side.

It is preferable to select a material for the elastic member 4 that has elasticity and heat-resisting characteristics. Urethane rubber having a circular section and being formed in a string-like shape is used in this embodiment. It is alternatively possible to use a spring member or a cork material formed in a string-like shape.

Each mounting tool 5 is comprised of a rod-like L-shaped member 6 having a section of letter L, a bolt 7 piercing through the package 1 and the L-shaped material 6, and a nut 8 for providing screw-fit with the bolt 7.

The arrangement of the heat sink 3 of the present invention will be explained in more detail based on FIG. 3.

The heat sink 3 of the present invention is comprised of cooling fins 9 and spacers 10. The cooling fins 9 and spacers 10 are connected by connecting rods 11 piercing through the cooling fins 9 and spacers 10, and they are fastened together by fastening tools 12 provided at both ends of the connecting rods 11.

Each cooling fin 9 is formed by bending the lower end of a rectangular metallic plate that has high thermal conductivity such as copper, aluminum and silver at an angle of 90° so as to assume a shape of letter L. This bent portion having the width equal to the thickness of each spacer 10 forms a heat-collecting portion 9a, and a portion extending upward from the heat-collecting portion 9a forms a heat-radiating portion 9b. Positioning holes 9c into which projections 10a formed on the spacers 10 are fitted and connecting rod inserting holes 9d for inserting the connecting rods 11 therethrough are formed in the cooling fins 9 at portions overlapping with the spacers 10. Projections 9e are formed in the heat-radiating portions 9b by stamping for increasing heat-radiating effects and for maintaining intervals between cooling fins 9. It is also possible to perform surface treatments on the cooling fins 9 so that the cooling fins 9 have weather-resistant or rust-preventing characteristics.

Spacers 10 are plate materials made of aluminum and provided between adjoining cooling fins 9 for maintaining intervals between the cooling fins 9. Each of the spacers 10 has a thickness of 2 to 3 mm. The spacers 10 are provided with projections 10a formed on surfaces thereof by striking so that the projections 10a fit in the positioning holes 9c of the cooling fins 9. The spacers 10 are further provided with connecting rod inserting holes 10b therein so that the connecting rods 11 are inserted through these inserting holes 10b. Stepped portions 10c on which the elastic members 4 are carried are formed on both ends of each of the spacers 10.

The connecting rods 11 are metallic thin rods piercing through the connecting rod-inserting holes 9d of the cooing fins 9 and through the connecting rod inserting holes 10b of the spacers 10 for connecting the cooling fins 9 and the spacers 10. The connecting rods 11 are made of relatively soft metal selected from brass, copper, aluminum, and the like.

The fastening tools 12 are provided on both ends of each of the connecting rods 11 though only those on the front side are illustrated in FIG. 3. The fastening members 12 are formed of spring steels and hold the connecting rods 11 by claws formed inside the fastening members 12.

In the heat sink 3 of the present invention with the above arrangement, the cooling fins 9 are connected by the connecting rods 11 with the spacers 10 interposed in between such that the fins 9 are movable slightly by twisting.

When the heat sink 3 is placed on the Peltier elements 2 and mounted by mounting tools with the Peltier elements 2 held between the package 1 and the heat sink 3, the heat-collecting portions 9a of the cooling fins 9 are pressed against the heat-producing surface of the Peltier element 2. Since the elastic elements 4 are provided between the L-shaped members 6 of the mounting tools 5 and the stepped portions 10c of the spacers 10, pressing force is applied evenly on each of the spacers 10. As a result, the heat-collecting portions 9a of the cooling fins 9 are aligned along the heat-producing surface of the Peltier elements 2 even though the heat-producing surface is slightly deformed and swelled.

Accordingly, heat of the heat-producing surface of the Peltier elements 2 is transmitted from the heat-collecting portions 9a of the cooling fins 9 to the heat-radiating portions 9b and radiated into air, thus cooling the Peltier elements 2 through these heat-radiating portions 9b of the cooling fins 9.

The above description is made for the first embodiment, and the second embodiment will be explained based on FIGS. 4 and 5 below.

In the second embodiment, the arrangement for pressing the heat sink against the Peltier elements differs from that of the first embodiment. However, as in the first embodiment, the heat-collecting portions are formed by bending the lower ends of the cooling fins so as to assume the shape of letter L, the spacers are provided between adjoining cooling fins, and the cooling fins and the spacers are connected by the connecting rods in an overlapped manner. Thus, the explanations of these components are omitted, and only the differently arranged structure than those of the first embodiment will be explained.

The reference numeral 1 denotes a metallic package accumulating therein an object to be cooled, and the cooling surface of Peltier elements 2 is arranged so as to closely fit to the metallic package 1.

The reference numeral 13 denotes the heat sink according to the second embodiment of the present invention that is carried on the heat-radiating surface of the Peltier elements 2.

The heat sink 13 is connected by connecting rods 16 piercing through portions at which cooling fins 17 and spacers 18 are overlapped, and an elastic member 14 is provided below each of the connecting rods 16. The connecting rods 16 are mounted by being pressed toward the Peltier elements 2 side by mounting tools 15 hooked to both ends of the connecting rods 16.

For the elastic member 14, it is preferable to select a material that has elasticity and heat-resisting characteristics. Urethane rubber having a circular section and formed in a string-like shape is used in this embodiment. It is alternatively possible to use a spring member or a cork material formed in a string-like shape.

The mounting tools 15 are tension coil springs in this embodiment.

Hooking holes 16a are formed in both ends of each of the connecting rods 16 for hooking end portions 15a of the coil springs thereat, the end portions being formed to assume hook-like shapes.

Connecting rod inserting holes of the cooling fins 17 and of the spacers 18 of the heat sink 13 of this embodiment are formed so that the elastic members 14 and the connecting rods 16 are inserted into the connecting rod inserting holes.

In the heat sink 13 of the second embodiment with the above-described arrangement, the cooling fins 17 are overlapped with the spacers 18 interposed in between; and the cooling fins 17 and spacers 18 are connected by the connecting rods 16 piercing the fins and spacers such that the cooling fins 17 are allowed to make not only slightly twisting movements but also slightly vertical movements.

When the heat sink 13 is placed on the Peltier elements 2 and mounted by the mounting tools 15 with the Peltier elements 2 held between the package 1 and the heat sink 13, the heat-collecting portions of the cooling fins 17 are pressed against the heat-producing surface of the Peltier elements 2. Since the elastic elements 14 are installed between the connecting rods 16 and the spacers 18, pressing force is applied evenly on each of the spacers 18. As a result, the heat-collecting portions of the cooling fins 17 are aligned along the heat-producing surface even though this heat-producing surface is slightly deformed and swelled.

Accordingly, heat of the heat-producing surface of the Peltier elements 2 is transmitted from the heat-collecting portions to the heat-radiating portions of the cooling fins 17 and radiated into air, thus cooling the Peltier elements 2.

In the above first and second embodiments, the intervals between the cooling fins 9 and 17 are set to be 2 to 3 mm. However, it is possible to have intervals of maximum 20 mm. In this case, the spacers 10 and 18 made of plastic materials or the like can be used.

The heat sink of the present invention is cooled using a fan or using natural flow of air.

While the heat sink of the present invention is described above with reference to cooling of an electronic component, it is possible to cool other heat-producing devices.

Since the heat sink of the present invention is arranged in the above-described manner, the heat-collecting portions of the cooling fins can be well aligned along the heat-radiating surface of an electronic component that has some swells. Thus, improved heat-radiation effects can be achieved.

Since the cooling fins can be installed at intervals of several millimeters, a large number of cooling fins can be installed so that a further improved heat-radiation effects can be achieved.

Deformations in the electronic component due to thermal expansion will not cause a breakdown of the electronic component since the heat sink of the present invention is not put in a direct contact with the electronic component.

The heat sink of the present invention can be manufactured in simple facilities so as to cut expenses, and no particular manufacturing techniques are required.

What is claimed is:

1. A heat sink comprising a plurality of cooling fins each being formed to assume a shape of letter L by bending a lower end of a metallic plate with bent portions serving as heat-collecting portions, and a plurality of spacers provided between said cooling fins for maintaining intervals between said cooling fins and for pressing said heat-collecting portions of said cooling fins to a heat-radiating surface of an electronic component, wherein said cooling fins and said spacers are connected by connecting rods piercing through portions at which said cooling fins and said spacers are overlapped.

2. The heat sink according to claim 1, wherein projections are formed on heat-radiating portions of said cooling fins.

3. The heat sink according to claim 1, wherein convex portions are formed on surfaces of said spacers and holes are formed in said cooling fins at portions corresponding to said convex portions for fitting said convex portions therein.

4. The heat sink according to claim 2, wherein convex portions are formed on surfaces of said spacers and holes are formed in said cooling fins at portions corresponding to said convex portions for fitting said convex portions therein.

5. The heat sink according to claim 1, wherein said spacers are pressed toward said electronic component side by means of mounting tools with an elastic member interposed in between so as to make said heat-collecting portions of said cooling fins fit along said heat-radiating surface of said electronic component.

6. The heat sink according to claim 2, wherein said spacers are pressed toward said electronic component side by means of mounting tools with an elastic member interposed in between so as to make said heat-collecting portions of said cooling fins fit along said heat-radiating surface of said electronic component.

7. The heat sink according to claim 3, wherein said spacers are pressed toward said electronic component side by means of mounting tools with an elastic member interposed in between so as to make said heat-collecting portions of said cooling fins fit along said heat-radiating surface of said electronic component.

8. The heat sink according to claim 4, wherein said spacers are pressed toward said electronic component side by means of mounting tools with an elastic member interposed in between so as to make said heat-collecting portions of said cooling fins fit along said heat-radiating surface of said electronic component.

9. The heat sink according to any one of claims 1 to 8, wherein an elastic member is provided below said connecting rods for pressing said spacers with said elastic member interposed in between by pressing said connecting rods by said mounting tools for making said heat-collecting portions of said cooling fin fit along said heat-radiating surface of said electronic component.

* * * * *